(12) United States Patent
Mokerji

(10) Patent No.: US 6,242,100 B1
(45) Date of Patent: *Jun. 5, 2001

(54) CHROME COATING HAVING A TOP LAYER THEREON

(75) Inventor: Subrata Mokerji, Shelby Township, MI (US)

(73) Assignee: MascoTech Coatings, Inc., China Township, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 08/905,207

(22) Filed: Aug. 1, 1997

(51) Int. Cl.[7] .................... B32B 27/36; B32B 15/08; B32B 27/00

(52) U.S. Cl. .............. 428/412; 428/416; 428/425.8; 428/461; 428/462; 428/603; 428/622; 428/626; 428/635

(58) Field of Search ............... 428/603, 622, 428/626, 635, 412, 416, 425.8, 461, 462

(56) References Cited

U.S. PATENT DOCUMENTS

| | | | |
|---|---|---|---|
| 3,838,512 | 10/1974 | Sanderson | 30/346.54 |
| 3,977,839 | 8/1976 | Palisin, Jr. | 428/626 |
| 4,109,052 | * 8/1978 | Anderson | 428/409 |
| 4,148,967 | 4/1979 | Satoh et al. | 428/416 |
| 4,305,981 | * 12/1981 | Muroi | 428/31 |
| 4,321,299 | 3/1982 | Frosch et al. | 442/378 |
| 4,369,225 | * 1/1983 | Manabe | 428/334 |
| 4,374,717 | * 2/1983 | Drauglis | 204/192.14 |
| 4,911,811 | * 3/1990 | Mullaney | 204/192.14 |
| 4,931,366 | * 6/1990 | Mullaney | 428/622 |
| 5,510,164 | 4/1996 | Best et al. | 428/64.1 |
| 5,589,280 | 12/1996 | Gibbons et al. | 428/626 |
| 5,656,335 | 8/1997 | Schwing et al. | 427/447 |

* cited by examiner

Primary Examiner—Leszek Kiliman
(74) Attorney, Agent, or Firm—Myron B. Kapustij; Lloyd D. Doigan

(57) ABSTRACT

An article is coated with a multi-layer coating comprising a polymeric layer deposited on the surface of the article, a chrome layer deposited on the polymeric layer, and a polyurethane layer deposited on the chrome layer.

5 Claims, 1 Drawing Sheet

CHROME COATING HAVING A TOP LAYER THEREON

FIELD OF THE INVENTION

The instant invention relates to a substrate having a leveling plastic coating thereon, a decorative chrome layer on the plastic coating, and a protective polyurethane coating over the chrome layer.

SUMMARY OF THE INVENTION

In accordance with this invention a plastic basecoat is provided on the surface of the substrate. The polymeric basecoat provides a leveling effect to the surface of the substrate. A decorative chrome layer is then applied onto the basecoat. A protective polyurethane top coat is provided over the chrome layer.

BACKGROUND OF THE INVENTION

Thin chrome layers have been applied by electroplating or vapor deposition onto the surfaces of various substrates to provide a decorative and shiny appearance thereto. However, the substrates have had to be pretreated as by polishing, cleaning and the like to remove any scratches or other imperfections from their surfaces before the chrome layer is applied thereon. Otherwise, the chrome layer will enhance and accentuate these imperfections. Also, the chrome layer is subject to abrasion, scratching and weathering, particularly if it is applied onto a part of a vehicle such as, for example, a wheel cover.

The present invention provides a substrate having a decorative chrome layer which is not subject to the aforementioned disadvantages.

DESCRIPTION OF THE PREFERRED EMBODIMENT

Figure 1:
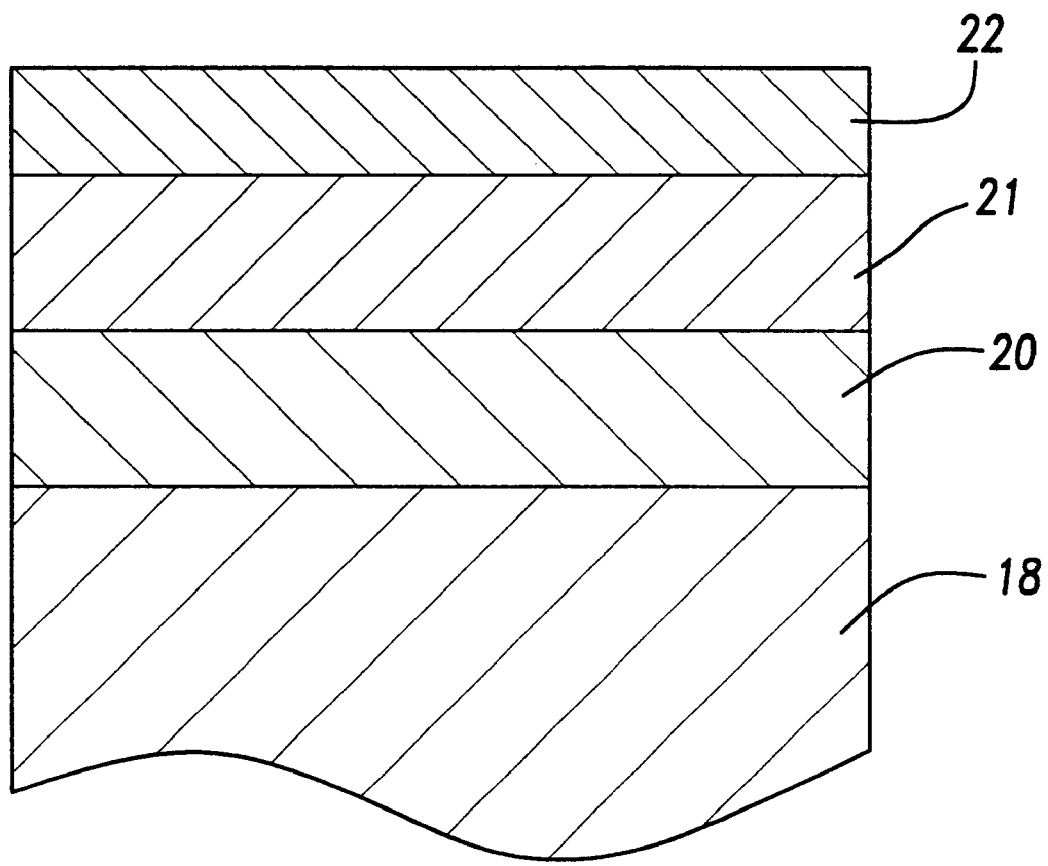
FIG. 1 is a cross-sectional view, not to scale of a portion of the substrate having the multi-layer coating on its surface.

The article or substrate 18 can be comprised of any suitable material such as plastic, ceramic, metal or metal alloy. The metals include nickel, aluminum, copper, steel and zinc. The metal alloys include nickel alloys and brass. The plastics forming the substrate include polycarbonates, nylon, acrylonitrile-butadienestyrene, polyesters, polyvinylchlorides, and the like. In one embodiment the article is part of a vehicle, such as for example, a wheel cover.

Over the surface of the substrate 18 is deposited a polymeric or resinous layer 20. The polymeric or resinous layer or basecoat 20 may be comprised of both thermoplastic and thermoset polymeric or resinous material. These polymeric or resinous materials include the well known, conventional and commercially available polycarbonates, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof.

The polycarbonates are described in U.S. Pat. Nos. 4,579,910 and 4,513,037, both of which are incorporated herein by reference.

Nylons are polyamides which can be prepared by the reaction of diamines with dicarboxylic acids. The diamines and dicarboxylic acids which are generally utilized in preparing nylons generally contain from two to about 12 carbon atoms. Nylons can also be prepared by additional polymerization. They are described in "Polyamide Resins", D. E. Floyd, Reinhold Publishing Corp., New York, 1958, which is incorporated herein by reference.

The polyepoxies are disclosed in "Epoxy Resins", by H. Lee and K. Neville, McGraw-Hill, New York, 1957, and in U.S. Pat. Nos. 2,633,458; 4,988,572; 4,680,076; 4,933,429 and 4,999,388, all of which are incorporated herein by reference.

The polyesters are polycondensation products of an aromatic dicarboxylic acid and a dihydric alcohol. The aromatic dicarboxylic acids include terephthalic acid, isophthalic acid, 4,4'-diphenyl-dicarboxylic acid, 2,6-naphthalenedicarboxylic acid, and the like. Dihydric alcohols include the lower alkane diols with from two to about 10 carbon atoms such as, for example, ethylene glycol, propylene glycol, cyclohexanedimethanol, and the like. Some illustrative nonlimiting examples of polyesters include polyethylene terephthalate, polybutylene terephthalate, polyethylene isophthalate, and poly(1,4-cyclohexanedimethylene terephthalate). They are disclosed in U.S. Pat. Nos. 2,465,319; 2,901,466 and 3,047,539, all of which are incorporated herein by reference.

The polyacrylates and polymethacrylates are polymers or resins resulting from the polymerization of one or more acrylates such as, for example, methyl acrylate, ethyl acrylate, butyl acrylate, 2-ethylhexyl acrylate, etc., as well as the methacrylates such as, for instance, methyl methacrylate, ethyl methacrylate, butyl methacrylate, hexyl methacrylate, etc. Copolymers of the above acrylate and methacrylate monomers are also included within the term "polyacrylates or polymethacrylates" as it appears herein. The polymerization of the monomeric acrylates and methacrylates to provide the polyacrylate resins useful in the practice of the invention may be accomplished by any of the well known polymerization techniques.

The styrene-acrylonitrile and acrylonitrile-butadiene-styrene resins and their preparation are disclosed, inter alia, in U.S. Pat. Nos. 2,769,804; 2,989,517; 2,739,142; 3,991,136 and 4,387,179, all of which are incorporated herein by reference.

The alkyd resins are disclosed in "Alkyd Resin Technology", Patton, Interscience Publishers, NY, N.Y., 1962, and in U.S. Pat. Nos. 3,102,866; 3,228,787 and 4,511,692, all of which are incorporated herein by reference.

These polymeric materials may optionally contain the conventional and well known fillers such as mica, talc and glass fibers.

The polymeric layer or basecoat 20 may be applied onto the surface of the substrate by any of the well known and conventional methods such as dipping, spraying and brushing.

The polymeric layer 20 functions, inter alia, to level the surface of the substrate, cover any scratches or imperfections in the surface and provide a smooth and even surface for the deposition of the chrome layer.

The polymeric layer 20 has a dry or cured thickness at least effective to level out the surface of the substrate. Generally, this thickness is from about 0.1 mils to about 10 mils, preferably from about 0.2 mils to about 5 mils, and more preferably from about 0.3 mils to about 1.5 mils.

The chrome layer 21 may be deposited on the polymeric layer 20 by any of the conventional and well known chrome deposition techniques including vapor deposition such as physical vapor deposition and electroplating techniques. The electroplating techniques along with various chrome plating baths are disclosed in Brassard, "Decorative Electroplating—A Process in Transition", Metal Finishing, pp. 105–108, June 1988; Zaki, "Chromium Plating", PF Directory, pp. 146–160; and in U.S. Pat. Nos. 4,460,438, 4,234,396 and 4,093,522, all of which are incorporated herein by reference.

Chrome plating baths are well known and commercially available. A typical chrome plating bath contains chromic acid or salts thereof, and catalyst ion such as sulfate or fluoride. The catalyst ions can be provided by sulfuric acid or its salts and fluosilicic acid. The baths may be operated at a temperature of about 112°–116° F. Typically in chrome plating a current density of about 150 amps per square foot, at about five to nine volts is utilized.

Generally, the plating of trivalent chrome is preferred because of environmental considerations.

The vapor deposition of the chrome is conventional and well known in the art and includes techniques such as cathodic arc evaporation (CAE) or sputtering. Sputtering techniques and equipment are disclosed, inter alia, in J. Vossen and W. Kern "Thin film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

Briefly, in the sputtering deposition process a metal (i.e., chrome) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as chrome. The arc vaporizes the cathode material, which then condenses on the substrates forming a coating.

The thickness of the chrome layer 21 is at least a thickness effective to provide a decorative appearance to the article. Generally this thickness is from about 200 Angstroms to about 35 microns, preferably from about 400 Angstroms to about 5,000 Angstroms.

The top coat 22 which is applied over the chrome layer should ideally be weather resistant, impact resistant, abrasion resistant, flexible, non-yellowing and transparent. The term "transparent" is defined as a coating through which the chrome layer can be seen. It is preferred that the transparent coating be substantially colorless so that the esthetic effects of the chrome layer are not substantially decreased. However, in some instances the addition of color to the transparent layer can be esthetically beneficial. Polymeric or resinous coating material which exhibit good mixture of all of these properties are polyurethanes, polyacrylates and polymethacrylates. Of these polyurethanes are preferred as they exhibit a particularly good blend of all of these properties.

Polyurethanes are well known in the art and are readily commercially available. Various known polyols and polyisocyanates are used to form polyurethanes. Polyurethanes are useful as coatings and are described, for example, in Chapter X, Coatings, pp. 453–607 in J. H. Saunders and K. C. Frisch, Polyurethanes: Chemistry and Technology, Part II, Interscience Publishers (N.Y., 1964), incorporated herein by reference.

Suitable polyurethanes may be prepared in a conventional manner such as by reacting polyols or hydroxylated polymers with organic polyisocyanates in the manner well known in the art. Suitable organic polyisocyanates include, for instance, ethylene diisocyanate; ethylidene diisocyanate; propylene-1,2-diisocyanate; cyclohexylene-1,2-diisocyanate; m-phenylene diisocyanate; 2,4-toluene diisocyanate; 2,6-toluene diisocyanate; 3,3'-dimethyl-4,4'-biphenylene diisocyanate; p,p',p"-triphenylmethane triisoene diisocyanate; 3,3'-diphenyl-4,4'-biphenylene diisocyanate; 4,4'-biphenylene diisocyanate; 3,3'-dichloro-4,4-biphenylene diisocyanate; p.p',p"-triphenylmethane triisocyanate; 1,5-mepthalene diisocyanate; furfurylidene diisocyanate or polyisocyanates, in a blocked or inactive form such as the bisphenyl carbamates of 2,4- or 2,6-toluene diisocyanate; p.p'-diphenyl methane diisocyanate; p-phenylene diisocyanate; 1,5-napthalene diisocyanate and the like. It is preferred to use a commercially available mixture of toluene diisocyanates which contains 80 percent 2,4-toluene diisocyanate and 20 percent 2,6-toluene diisocyanate or 4,4-diphenylmethane diisocyanate.

Polyurethanes applied as coatings in accordance with the invention may, of course, be in the form of solutions in suitable solvents such as xylene, toluene, methyl ethyl ketone, butanol, butyl acetate, etc.

Materials for the polyurethane coatings may be supplied in one package or two package prepolymer systems or oil modified systems, etc., all in the manner well known in the industry. Such materials are described for instance in the pamphlet "Urethane Coatings", published by the Federation of Societies for Paint Technology (1970). Radiation-curable urethane coatings may also of course be used.

Some illustrative examples of suitable polyurethane compositions are disclosed in U.S. Pat. Nos. 4,699,814; 4,681,811; 4,703,101; 4,403,003 and 5,268,215, all of which are incorporated herein by reference.

Another suitable type of polyurethane is an acrylic polyurethane. The acrylic polyurethanes are described in U.S. Pat. Nos. 3,558,564; 4,131,571 and 4,555,535, all of which are incorporated herein by reference.

The dry or cured thickness of layer 22 is a thickness at least effective to protect the underlying chrome layer. Generally this thickness is from about 0.05 mil to about 10 mils, preferably from about 0.1 mil to about 3 mils and more preferably from about 0.3 mil to about 1.5 mils.

In order that the invention may be more readily understood the following example is provided. The example is illustrative and does not limit the invention thereto.

EXAMPLE 1

A steel substrate is ultrasonically cleaned and then heated at 250° F. to remove moisture. A basecoat polymeric layer is applied onto the cleaned and dried steel substrate by a standard and conventional high volume low pressure gun. The polymer is comprised of 35 weight percent styrenated acrylic resin, 30 weight percent melamine formaldehyde resin, and 35 weight percent bisphenol A epoxy resin. The polymer is dissolved in sufficient solvents to provide a polymeric composition containing about 43 weight percent solids. After the basecoat is applied onto the substrate the substrate is allowed to sit for 20 minutes for ambient solvent flash off. The substrate is then baked at 375° F. for 2 hours. The resulting cured polymeric basecoat has a thickness of about 0.8 mil.

The basecoated substrate is a placed on metallizing rack. The metallizing rack is placed into a vacuum chamber which is evacuated down to a vacuum level of 5×10E-5 torr. About 50 standard cubic centimeters per minute of argon is introduced into the chamber. An electric arc is struck at the end of a chrome target. As the arc travels from the back end of the target to the front, its polarity is reversed, thereby causing the arc to move back and forth to evaporate the chrome and deposit it on the coated substrate. A current of 500 amps is applied to the target. After 5 minutes the argon flow rate is increased to 75 standard cubic centimeters per minute and deposition of chrome is continued for another 5 minutes. The substrate is then allowed to cool inside the chamber and the chamber is vented. The chrome layer has a thickness of 800 Angstroms.

A topcoat polymeric composition containing 45 weight percent solids is applied onto the chrome layer by a high volume low pressure gun. The polymer component of the topcoat polymeric composition is comprised of styrenated hydroxylated acrylic resin.

After the topcoat is applied, the substrate is allowed to sit for about 20 minutes at ambient temperature for 20 minutes to allow the solvents to evaporate. The substrate is then baked at 160° F. for one hour to cure the resin topcoat. The cured resin topcoat has a thickness of 1 mil. The substrate has the appearance of chrome and is resistant to abrasion and corrosion.

While certain embodiments of the invention have been described for purposes of illustration, it is to be understood that there may be other additional various embodiments and modifications within the general scope of the invention.

I claim:

1. An article comprised of metal or metal alloy having on at least a portion of its surface a multi-layer coating comprising:

a layer comprised of polymeric material selected from the group consisting of polycarbonate, polyacrylate, polymethacrylate, polyepoxy, alkyd, acrylonitrile-butadiene-styrene, nylon, polystyrene, styrene-butadiene, styrene-acrylonitrile, and blends and copolymers thereof directly on at least a portion of the surface of said article;

a non-transparent layer comprised of chrome directly on said layer comprised of polymeric material; and a layer comprised of polyurethane directly on said layer comprised of chrome.

2. The article of claim 1 wherein said polyurethane is comprised of acrylic polyurethane.

3. An article having on at least a portion of its surface a multi-layer coating comprising:

a layer comprised of polymeric material selected from the group consisting of polycarbonate, polyacrylate, polymethacrylate, polyepoxy, alkyd, acrylonitrile-butadiene-styrene, nylon, polystyrene, styrene-butadiene, styrene-acrylonitrile, and blends and copolymers thereof directly on at least a portion of the surface of said article;

a non-transparent layer comprised of chrome directly on said layer comprised of polymeric material; and a layer comprised of plyurethane directly on said layer comprised of chrome.

4. The article of claim 3 wherein said polyurethane is comprised of acrylic polyurethane.

5. The article of claim 1 wherein said polymeric material is selected from polycarbonate, polyester, polyacrylate, polymethacrylate, acrylonitrile-butadiene-styrene, nylon, polystyrene and styrene-acrylonitrile.

* * * * *